(12) United States Patent
Dearn et al.

(10) Patent No.: US 7,301,347 B2
(45) Date of Patent: Nov. 27, 2007

(54) CURRENT SENSING CIRCUIT

(75) Inventors: David Dearn, Malmesbury (GB); Holger Haiplik, Swindon (GB)

(73) Assignee: Wolfson Microelectronics plc, Edinburgh (GB)

( * ) Notice: Subject to any disclaimer, the term of this patent is extended or adjusted under 35 U.S.C. 154(b) by 29 days.

(21) Appl. No.: 11/318,458

(22) Filed: Dec. 28, 2005

(65) Prior Publication Data

US 2007/0096748 A1   May 3, 2007

(30) Foreign Application Priority Data

Oct. 27, 2005   (GB)   ................................. 0521896.1

(51) Int. Cl.
*G01R 31/08* (2006.01)
*G01R 27/08* (2006.01)
*G01R 19/00* (2006.01)

(52) U.S. Cl. .................. 324/522; 324/713; 327/53

(58) Field of Classification Search ................ 324/522, 324/512, 500, 177, 76.11, 713, 158.1, 71.1; 327/51–53, 65, 66, 538, 543, 316; 323/316
See application file for complete search history.

(56) References Cited

U.S. PATENT DOCUMENTS

| 4,929,884 | A |   | 5/1990  | Bird et al. |
|-----------|---|---|---------|-------------|
| 5,039,878 | A |   | 8/1991  | Armstrong et al. |
| 5,055,719 | A |   | 10/1991 | Hughes |
| 5,473,275 | A |   | 12/1995 | Hughes et al. |
| 5,757,174 | A |   | 5/1998  | Ki |
| 5,815,027 | A | * | 9/1998  | Tihanyi et al. ............... 327/543 |
| 6,011,413 | A | * | 1/2000  | Hayakawa et al. ........... 327/51 |
| 6,559,684 | B2| * | 5/2003  | Goodfellow et al. .......... 327/53 |
| 6,600,362 | B1|   | 7/2003  | Gavnla |
| 6,888,401 | B1|   | 5/2005  | Tanase |
| 6,937,025 | B1| * | 8/2005  | Fong et al. .................. 324/522 |

(Continued)

FOREIGN PATENT DOCUMENTS

EP        1 544 703        6/2005

(Continued)

OTHER PUBLICATIONS

P. Allen, et al., "Cascode OP Amps", *CMOS Analog Circuit Design*, New York, Holt Rinehart & Winston, U.S., 1987, pp. 403-426.

*Primary Examiner*—Vincent Q. Nguyen
*Assistant Examiner*—Hoai-An D. Nguyen
(74) *Attorney, Agent, or Firm*—Dickstein Shapiro LLP

(57) ABSTRACT

A current sensing circuit for sensing the current through a main switch, such as the PMOS or NMOS switches of a switching regulator, is disclosed. The circuit includes a mirror switch, said mirror switch being substantially similar to said main switch but with a smaller aspect ratio, a difference amplifier for ensuring that the voltage across said first leg and across said second leg are substantially equal and thereby to derive from said mirror switch a sensing current nominally equal to a current flowing in said main switch divided by a sensing ratio, a current source for producing a quiescent current in said difference amplifier and a compensatory device for compensating for said quiescent current such that said current sensing circuit can sense currents in the main switch which are smaller than the quiescent current multiplied by the sensing ratio. The compensatory device may be one or two switches essentially similar to the mirror switch.

28 Claims, 7 Drawing Sheets

U.S. PATENT DOCUMENTS

| | | |
|---|---|---|
| 7,034,542 B2 * | 4/2006 | Peterson .................... 324/522 |
| 7,205,771 B2 * | 4/2007 | Berton ...................... 324/522 |
| 2002/0063573 A1 | 5/2002 | Genova et al. |
| 2004/0046576 A1 * | 3/2004 | Manhaeve et al. .......... 324/713 |
| 2004/0189351 A1 | 9/2004 | Tai et al. |
| 2007/0075711 A1 * | 4/2007 | Blanc et al. ................ 324/713 |

FOREIGN PATENT DOCUMENTS

| | | |
|---|---|---|
| GB | 02217938 | 1/1989 |
| JP | 07113826 | 5/1995 |
| JP | 2004023638 | 1/2004 |
| WO | WO 02/31517 | 4/2002 |

\* cited by examiner

CURRENT SENSING CIRCUIT

PRIOR APPLICATION DATA

The present application claims priority from prior UK application GB 0521896.1, filed on Oct. 27, 2005, incorporated by reference herein in its entirety.

FIELD OF THE INVENTION

The present invention relates to current controlled switching mode regulator circuits and in particular to current sensing arrangements in such circuits.

BACKGROUND OF THE INVENTION

Switching regulators are very commonly used in DC-DC conversion as they offer higher efficiency than linear regulators. They typically consist, in their most basic form, of an inductor, a first switch and a diode (or second switch), the latter two components switching the inductor alternately between charging and discharging states, in response to signals from a controller. These basic elements can be arranged to form a step-down (buck), step-up (boost) or inverting (buck-boost) regulator.

It is well described in the literature that by sensing the current in the inductor (possibly via sensing the current in the switch), and using this sensed current in the control algorithm for the switch, certain benefits can be gained. The main advantage is that the control loop can be reduced from second order (2 pole), to approximately first order (1 pole). Other advantages are greater line rejection, and the instantaneous detection of peak current in the inductor. This control method is called "current mode control"

One of the main difficulties with current mode control is accurately measuring the current in the inductor on a cycle by cycle basis. One way of doing this would be placing a resistor in series with the first switch on the supply side. This would have little common mode shift as the switch is turned on and off. Equally a resistor could be placed in series with the diode or second switch on the ground side to the same effect. A resistor in series with the inductor on the switch side would probably have large common mode shift and, for a low output voltage, could prove challenging to implement on the output side of the inductor necessitating a very wide common mode range on the amplifier sensing the voltage across the resistor. All these techniques also suffer from loss in the resistive component, and the necessity for a low value, but accurate resistor (which is difficult and expensive to achieve on silicon).

One technique to avoid these problems is to mirror either the first switch or the second switch with another much smaller transistor with similar properties, having say 1:10000 ratio in size between them. This could be done by using a single cell of a multi-cell switch as the mirror.

The examples shown will concentrate on the mirroring of the first switch. However it should be noted that the invention is equally applicable to circuits mirroring the second switch.

A problem with many known mirror circuits is that they require a quiescent current to operate. While this quiescent current may be small by itself, it can result in much greater currents not being detected by the current sensing circuit. This is because the current sense output may be 10000 times smaller than the input and therefore unable to detect inductor currents 10000 times the quiescent current. Thus for light loads the current sensed will become zero and the converter may not work or may become unstable.

SUMMARY OF THE INVENTION

It is an aim of the invention to address the above problem and to provide a current sensing circuit which can sense smaller inductor currents despite the quiescent current taken by the sensing circuit to operate.

In a first aspect of the invention there is provided a current sensing circuit for sensing the current through a main switch, said circuit comprising: a mirror switch, said mirror switch being substantially similar to said main switch but of different dimensions, a difference amplifier having a first leg and a second leg connected respectively to the output electrodes of said main switch and said mirror switch, said difference amplifier ensuring that the voltage across said first leg and across said second leg are substantially equal and thereby to derive from said mirror switch a sensing current nominally equal to a current flowing in said main switch divided by a sensing ratio, and a current source for producing a quiescent current in said difference amplifier, wherein there is further provided a compensatory device for compensating for said quiescent current such that said current sensing circuit can sense currents in the main switch which are smaller than the quiescent current multiplied by the sensing ratio.

It should be noted that the term "main switch" refers to the switch being mirrored, and may be the "first switch" or "second switch" of the above introduction.

Said first mirror switch may be dimensioned to obtain a sensing ratio in the region of 10,000-100,000, although this sensing ratio conceivably could be 1000 or even 100. This may be achieved by it having an area or aspect ratio in the region of four or five orders of magnitude smaller than that of said main switch. It may comprise one cell isolated from the main switch, the main switch being comprised of a plurality of similar cells. Isolated in this case means electrically, not necessarily physically isolated, as it may be desirable for the single cell mirror switch to reside with the main switch so that ambient conditions are the same for both.

Said compensatory device may comprise a resistive element located in the first leg of said difference amplifier. Said resistive element should have substantially the same characteristics than that of the first mirror switch. Said resistive element preferably comprises a device substantially similar to said mirror switch and arranged to be always on.

Said compensatory device may purposely overcompensate for said quiescent current. This may be achieved by providing two resistive elements in series or a resistive element with greater resistance than said first mirror switch in the first leg of said difference amplifier. In one embodiment there are provided two devices substantially similar to said mirror switch in series arranged to be always on. In an alternative embodiment the overcompensation is achieved by having one device substantially similar to said mirror switch but passing a larger current (possibly two-times) than the quiescent current through it. This may be achieved by providing a further current source in series with a single mirror switch and in parallel with said difference amplifier.

Said difference amplifier may comprise first and second difference amplifier transistors, said first and second difference amplifier transistors being substantially similar to one another and each having a control electrode and first and second main current-carrying electrodes, and arranged such that their control electrodes are tied together and that they are always on; and a further transistor, said further transistor arranged to control the current through the first difference amplifier transistor. As a result the voltages across the first leg and second leg of the difference amplifier are equal and the current ratio between the main switch and the mirror switch is maintained. Said transistors may be MOSFETS.

Said difference amplifier may be further provided with dummy transistors. These may be arranged such that inputs of said difference amplifier are switched to these when said main switch and first mirror switch are off.

Said switches may all comprise MOSFETS. The circuits may be arranged for either PMOS switches or NMOS switches depending on the main switch type.

The above and other features and advantages of the invention will be understood from a consideration of the description of specific embodiments which follows.

BRIEF DESCRIPTION OF THE DRAWINGS

Embodiments of the invention will now be described, by way of example only, by reference to the accompanying drawings, in which.

DETAILED DESCRIPTION OF THE EMBODIMENTS

Figure 1:
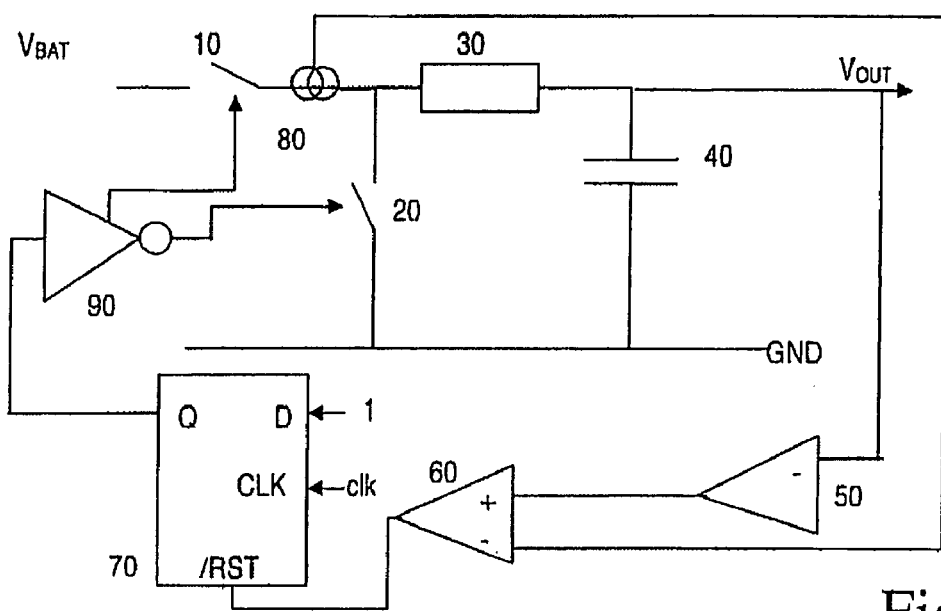
FIG. 1 shows a basic known buck converter arrangement.

FIG. 1 shows a basic, constant frequency, current mode control buck converter (although the invention is equally applicable in use with other types of converters e.g. boost or buck-boost). The converter consists of a PMOS switch 10 in series with a NMOS switch 20 (or possibly a diode) between a voltage source $V_{BAT}$ and ground GND. In parallel with the NMOS switch 20 (also in series with the PMOS switch) is an inductor 30 and a capacitor 40. Converter output $V_{OUT}$ is taken from the node between inductor 30 and capacitor 40. The output voltage is also fed into an error amplifier 50. The output of the error amplifier 50 is fed into one input of a comparator 60. A current monitor 80 generates a signal representative of the current in inductor 30, and this is fed to the inverting input of comparator 60. The output of the comparator 60 is fed to the reset input of a latch 70 which controls switches 10 and 20 via gate 90.

Control of the switch 10 has been achieved previously by techniques such as "voltage mode control" and "current mode control". Typically, the PMOS switch 10 is connected to an input voltage and is closed at the beginning of a clock cycle. Closing the switch 10 causes the current in the inductor 30 connected between the switch and the output of the converter to rise. When the output of the inductor current monitor 80 exceeds the output of the error amplifier 50, the comparator 60 resets latch 70. This causes the PMOS switch 10 to be turned off, and not turned on again until the beginning of the next clock cycle while the NMOS switch 20 is driven in anti-phase with the PMOS switch 10. In this way the output voltage is controlled to the required value.

Figure 2:
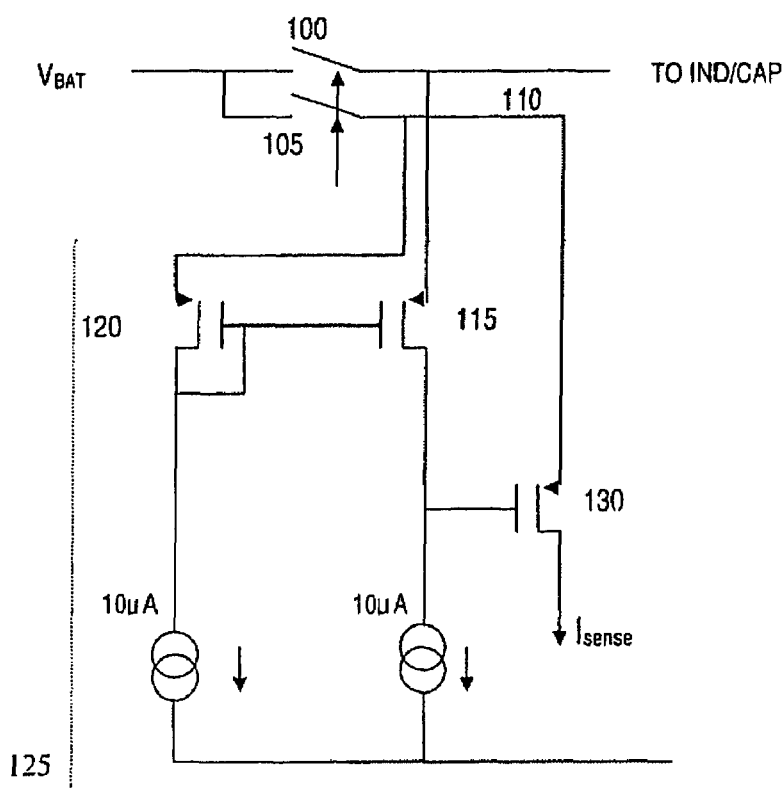
FIG. 2 shows a known current sensing arrangement.

FIG. 2 shows a preferred form of current monitor 80 using the current mirror principle for sensing the current in the PMOS switch 100 of FIG. 1. The main converter components of FIG. 1 are not shown. This shows the main PMOS switch 100 and, in parallel with it, mirror switch 105. The mirror switch 105 is substantially identical to the main PMOS switch 100, except for its dimensions. The main PMOS switch 100 and the mirror switch 105 have common source, gate and bulk connections. The main PMOS switch 100, as before, is connected between voltage source $V_{BAT}$ and the inductor (not shown), while the mirror switch 105 is connected between $V_{BAT}$ and a sense leg 110 which forms part of the current monitor. A difference amplifier 125 is provided by two PMOS devices 115, 120. The first of these devices 115 has its source connected to the inductor side of the PMOS switch 100 and the second device 120 has its source connected to the sense side of the mirror switch 105. A further PMOS device 130 provides the output of the amplifier 125 and is provided in the sense leg 110. Device 130 has its gate tied to the drain of PMOS device 115

In the case of MOSFETs, the aspect ratio of the mirror switch 105 compared to the main PMOS switch 100 determines the sensing ratio. Typically the width (W) of the main PMOS switch 100 is very large, say 10 mm, and therefore the width of the mirror device may be 10 μm to scale by 1000, for the same length (L) (say 0.5 μm). In this case the channel area, and the total area of the mirror device, will end up smaller. Conceivably L might also be increased, to say 5 μm, to give a further 10 times scaling of current without making the width too small. In this case the aspect ratio would reduce, but the area would in fact increase. This contrasts with bipolar transistors, where the sensing ratio is given approximately by the ratio of their emitter areas. In the examples below the sensing ratio will be 1:10000.

In operation differential amplifier 125 keeps the drain voltage of the mirror switch 105 the same as that of the main switch 100, such that the voltage across them matches precisely. Any difference in source voltage of the two common gate PMOS devices 115, 120 will cause the voltage on the drain of PMOS device 115 to rise or fall and thus pull the gate of the device 130 up or down, altering the current therein until the sources are more equal.

Current from the mirror switch 105 passes through the sense leg 110, through PMOS device 130, and is used to sense the current in the main PMOS switch 100. The ratio of this sense current $I_{sense}$ to the actual current being measured is the same as that of the size of the mirror switch 105 to main PMOS switch 100, i.e. 1:10000. Note that the main PMOS switch 100 and its PMOS mirror switch 105 will typically both be operating in linear or triode region, with the other PMOS devices 115, 120, 130 in saturation.

A problem with this circuit is that the 10 μA quiescent taken by the amplifier 125 means that in ideal conditions, no current is measured ($I_{sense}$=0) until the main PMOS switch 100 supplies 100 mA (10000*10 μA). This is because, if we assume that the main PMOS switch 100 has on-resistance ($R_{onPMOS}$) of 0.1 ohm, the mirror switch 105 will have an on-resistance of 1 kohm ($R_{onMIRROR}$). If input current $I_{in}$ is 100 mA then this 100 mA through the main PMOS switch 100 results in 10 mV being dropped across it. 10 μA through the PMOS mirror 105 also results in a 10 mV drop. Therefore the circuit is balanced (the same voltage being dropped across each leg of the differential amplifier 125) and the current in the sense leg 110, $I_{sense}$, equals zero. Similarly a 200 mA input means that there is 20 µA through the mirror switch resulting in only 10 µA for $I_{sense}$. Therefore $I_{sense}$=I/10000−10 µA=(I−100 mA)/10000 (for I>100 mA) or=0 otherwise. Thus for light loads the current in the inductor is measured as zero and the control mechanism of the converter may not work or could be unstable.

Figure 3:
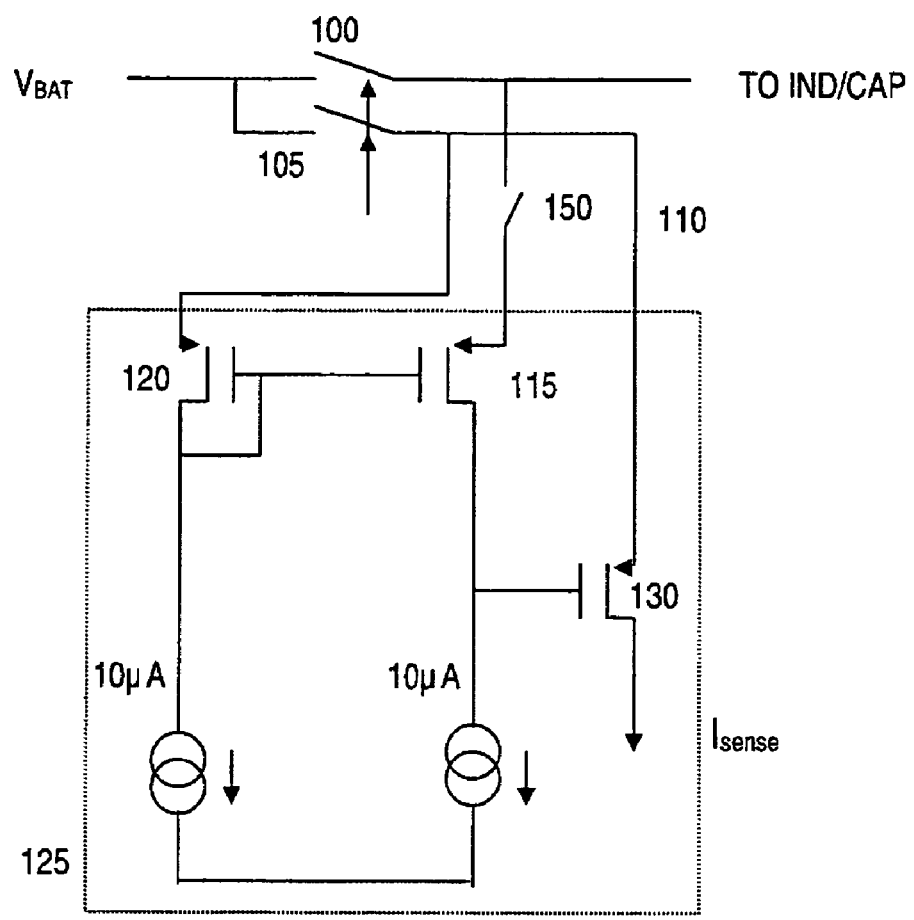
FIG. 3 shows a current sensing arrangement according to a first embodiment of the invention.

FIG. 3 shows a circuit similar to that of FIG. 2 adapted according to an embodiment of the invention. The circuit is essentially similar but with the addition of a copy device 150 similar to mirror switch 105 between the main PMOS switch 100 and the difference amplifier transistor 115. The device 150 is arranged to be permanently on with a similar gate voltage as 105 is connected to when "on".

Analysing this circuit using the same example component values as the previous drawing, and the same input current $I_{in}$ of 100 mA, this current in the main PMOS switch 100 again results in a drop of 10 mV across it. The copy device 150 induces a further drop of 10 $\mu A * R_{onMIRROR}$ (1 kohm in this example) which equals 10 mV. As the copy device 150 drops a further 10 mV, the mirror device 105 sees 20 mV across main PMOS switch 100 and the copy of the PMOS mirror switch and, to remain in equilibrium, delivers 20 µA. 10 µA of this is delivered down the left-hand leg, leaving 10 µA ($I_{sense}$) to go down the right-hand (sense) leg 110, and through PMOS device 130. As $I_{sense}$ is 1/10000 of the input current $I_{in}$ (that is the inductor current being measured), it can be seen that $I_{sense}$ is now correct and current is now sensed, in the ideal case, as soon as any current flows through the main PMOS switch 100. In principle, copy device 150 is acting as a simple resistor. Because it is a copy of mirror switch 105, and because copy device 150 will see very close to the same gate-source voltage $V_{gs}$ as the mirror device it will be a resistor with a very similar on-resistance ($R_{on}$) to that of mirror switch 105.

One remaining problem, however, is the case of offset in the amplifier (for example random manufacturing offset, or second order effects due to different drain voltages across the differential amplifier). An adverse offset could mean that current is still not sensed until greater than a certain threshold.

Figure 4:
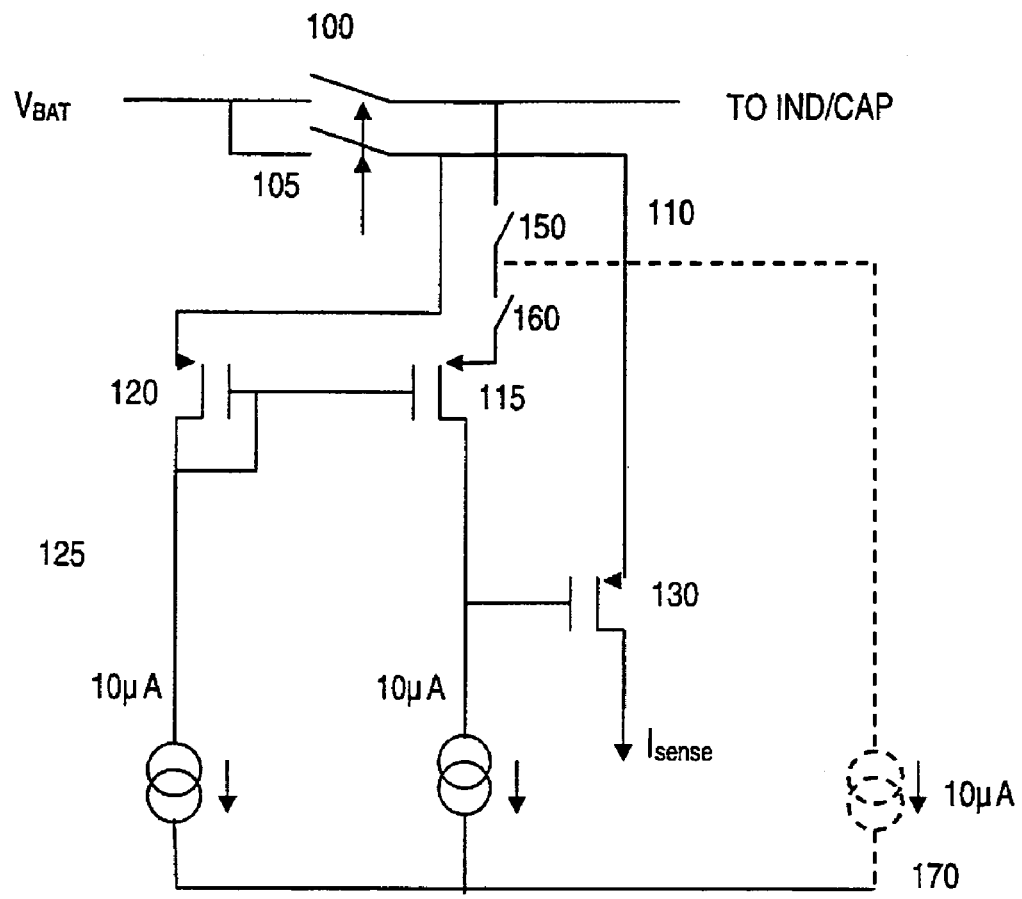
FIG. 4 shows a current sensing arrangement according to a second embodiment of the invention and an optional modification to make a third embodiment.

FIG. 4 shows two alternatives for addressing the offset problem. In one alternative a second copy device 160 is added to the main PMOS sensing leg in series with the first copy device 150. The other alternative shown (by dotted line) has only the one copy device 150 (device 160 should be ignored in this case) and a further 10 µA current source 170.

Both of these alternatives result in the sense circuit seeing (again using the component values of the previous example and input current of 100 mA) the equivalent of 10000*10 µA=100 mA in the main PMOS switch 100 even when there is no input, and makes the circuit immune to offsets equal to 100 $mA*R_{ONPMOS}$=10 mV. Of course with both of these approaches, there is now a static error of 100 mA in the current measurement (0 to 200 mA in the worst case), but this is not important for stability since it is only a DC shift.

Figure 4B:
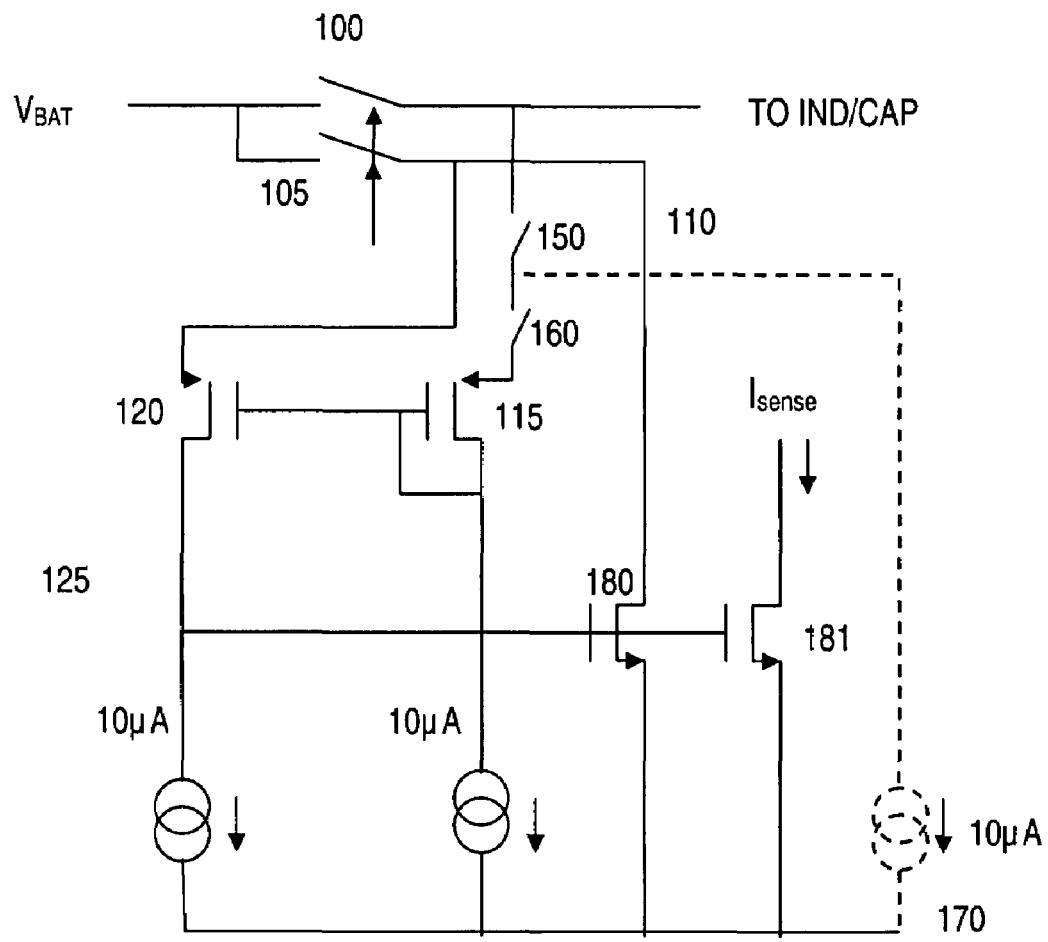
FIG. 4b shows a variation on the current sensing arrangement FIG. 4, incorporating NMOS device mirroring of current sense output.

FIG. 4b shows a variation which allows for multiple outputs $I_{sense}$ as well as allowing for further flexibility in the sensing ratio. In this variation the differential amplifier 125 is reversed and PMOS device 130 is replaced with NMOS device 180 which is mirrored with further NMOS device 181. If the NMOS devices 180 and 181 are identical then the sensing ratio will depend on the aspect ratios of main PMOS switch 100 and mirror device 105 as before, but if different, then the aspect ratio is further dependent on the aspect ratios of the NMOS devices 180, 181. Further copies of $I_{sense}$ are also easily obtained by adding further NMOS devices to mirror NMOS device 180. Each of these outputs can have its sensing ratio set independently depending on the aspect ratio of the mirroring NMOS.

It is also possible to mirror the PMOS device 130. Simply adding a further PMOS device in parallel with PMOS device 130 with common gate and source connections would split $I_{sense}$ between them (according to respective aspect ratios). However, copies of $I_{sense}$ obtained from the drain of PMOS device 130 can be generated by passing it through NMOS mirrors.

A further problem with the circuits depicted above is that the main switch 100 is switching on and off, and the measured current is valid only when it is on. When the main switch 100 is off, its drain voltage swings below ground. This causes massive swings on the difference amplifier, resulting in large recovery times.

Figure 5:
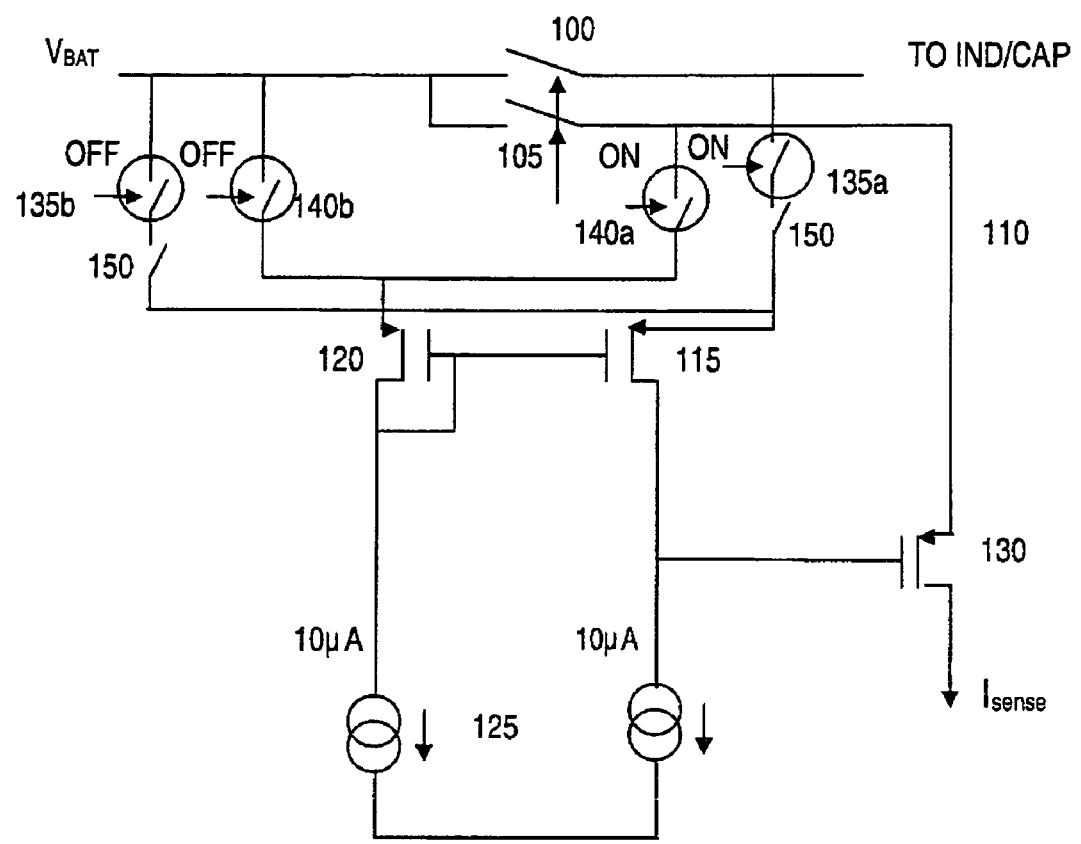
FIG. 5 shows a current sensing arrangement according to a fourth embodiment of the invention.

FIG. 5 shows an improvement to the circuit of FIG. 3. This shows essentially the same circuit as FIG. 3 with the addition of dummy PMOS devices 135a, 135b, 140a, 140b connected as shown. The amplifier senses the main PMOS switch 100 and mirror PMOS switch 105 via switches 135a and 140a, when the main PMOS switch 100 is ON. When the main PMOS switch 100 is OFF, the amplifier senses the supply via switches 135b and 140b to maintain the common mode point. Two copies 150a and 150b of the PMOS mirror switch are shown in this example, one (150a) in series with main PMOS switch 100 and dummy transistor 135a, the other (150b) in series with dummy transistor 135b.

Figure 6:
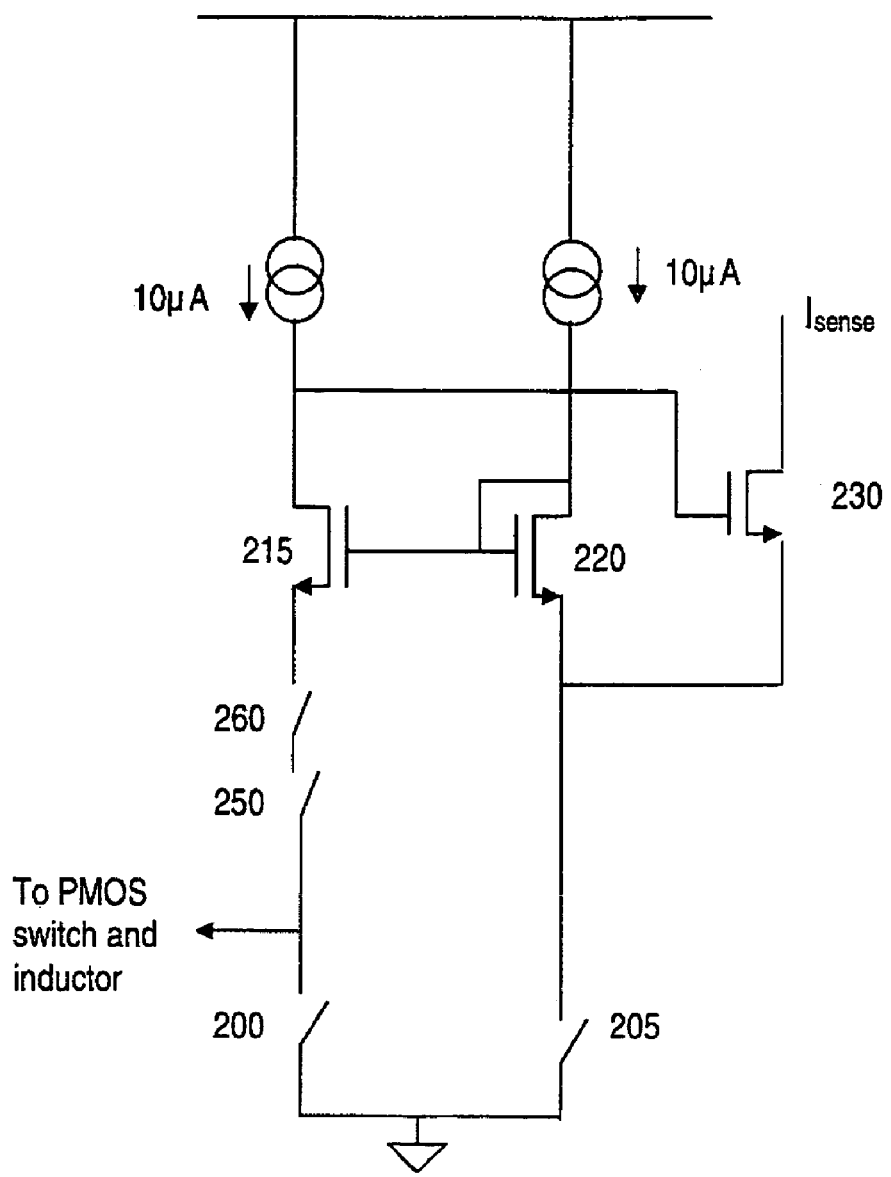
FIG. 6 shows a current sensing arrangement according to a fifth embodiment of the invention suitable for sensing current in an NMOS switch.

FIG. 6 shows an equivalent circuit to FIG. 4 but for sensing the second (NMOS) switch 20 in the converter of FIG. 1 instead of the first (PMOS) switch 10. This shows NMOS switch 200 being mirrored using NMOS mirror switch 205 in the same way as the PMOS switch was mirrored in previous examples. The NMOS mirror switch 205 is therefore identical to the main NMOS switch 200 in all but size. Devices 215, 220, 230 (NMOS in this case) form the current amplifier equalising the voltages through each leg as in the previous examples. As a result it will be apparent to the skilled person that this circuit operates essentially the same way as the circuit depicted in FIG. 4. Over-compensation for the quiescent current is provided in the form of the two copy NMOS switches 250, 260.

Although most examples shown have been created for current sensing in the PMOS switch of switching converters, the concept is applicable to any circuit that requires the sensing of current in a transistor, whether it is PMOS or NMOS.

The above examples are for illustration only and should not be taken as limiting. For instance, although the circuit technique is particular useful in switching applications such as Class D drives (switching) and switching chargers, it is also envisaged that such techniques can be applied to a wider range of applications that do not include switching (for example non-switching regulators).

The invention claimed is:

1. A current sensing circuit for sensing the current through a main switch, said circuit comprising:
   a mirror switch, said mirror switch being substantially similar to said main switch but of different dimensions,
   a difference amplifier having a first leg and a second leg connected respectively to the output electrodes of said main switch and said mirror switch, said difference amplifier ensuring that the voltage across said first leg and across said second leg are substantially equal and thereby to derive from said mirror switch a sensing current substantially equal to a current flowing in said main switch divided by a sensing ratio, a current source for producing a quiescent current in said difference amplifier, and a compensatory device for compensating for said quiescent current by causing a voltage drop in said first leg between said output electrode of said main switch and said difference amplifier, such that said current sensing circuit senses currents in the main switch which are smaller than the quiescent current multiplied by the sensing ratio.

2. The current sensing circuit according to claim 1 wherein said compensatory device comprises a resistive element located in the first leg of said difference amplifier.

3. The current sensing circuit according to claim 2 wherein said resistive element has substantially the same characteristics as that of the mirror switch.

4. The current sensing circuit according to claim 2 wherein said resistive element comprises a device substantially similar to said mirror switch and arranged to be always on.

5. The current sensing circuit according to claim 1 wherein said compensatory device overcompensates for said quiescent current.

6. The current sensing circuit according to claim 5 wherein there are provided two resistive elements in series in the first leg of said difference amplifier.

7. The current sensing circuit according to claim 5 wherein there is provided a resistive element with greater resistance than said mirror switch in the first leg of said difference amplifier.

8. The current sensing circuit according to claim 6 wherein there are provided two devices, substantially similar to said mirror switch, in series and arranged to be always on.

9. The current sensing circuit according to claim 5 wherein there is provided one device substantially similar to said mirror switch but a current larger than the quiescent current is passed through it.

10. The current sensing circuit according to claim 9 wherein the current passed through said one device substantially similar to said mirror switch is two-times the quiescent current.

11. The current sensing circuit according to claim 9 wherein there is provided a further current source in series with a single mirror switch and in parallel with said difference amplifier.

12. The current sensing circuit according to claim 1 wherein said first mirror switch is dimensioned to obtain a sensing ratio in the region of 1000-100000.

13. The current sensing circuit according to claim 1 wherein said mirror switch has an aspect ratio in the region of four or five orders of magnitude smaller than that of said main switch.

14. The current sensing circuit according to claim 1 wherein said mirror switch has an area in the region of four or five orders of magnitude smaller than that of said main switch.

15. The current sensing circuit according to claim 1 wherein said mirror switch comprises one cell isolated from the main switch, the main switch being comprised of a plurality of similar cells.

16. The current sensing circuit according to claim 1 wherein said difference amplifier comprises first and second difference amplifier transistors, said first and second difference amplifier transistors being substantially similar to one another and each having a control electrode and first and second main current-carrying electrodes, and arranged such that their control electrodes are tied together.

17. The current sensing circuit according to claim 16 wherein said difference amplifier comprises a further transistor, said further transistor arranged to control the current through the first difference amplifier transistor.

18. The current sensing circuit according to claim 16 wherein said transistors are MOSFETS.

19. The current sensing circuit according to claim 1 wherein said difference amplifier is further provided with dummy transistors.

20. The current sensing circuit according to claim 19 wherein said dummy transistors are arranged such that inputs of said difference amplifier are switched to the dummy transistors when said main switch and mirror switch are off.

21. The current sensing circuit according to claim 1 wherein each of said switches comprise MOSFETS.

22. The current sensing circuit according to claim 21 wherein the circuits are arranged for either PMOS switches or NMOS switches depending on the main switch type.

23. A current sensing circuit for sensing the current through a main switch, said circuit comprising:

a mirror switch, said mirror switch being substantially similar to said main switch but of different dimensions, a difference amplifier having a first leg and a second leg connected respectively to the output electrodes of said main switch and said mirror switch, said difference amplifier ensuring that the voltage across said first leg and across said second leg are substantially equal and thereby to derive from said mirror switch a sensing current substantially equal to a current flowing in said main switch divided by a sensing ratio, a current source for producing a quiescent current in said difference amplifier, and a compensatory device for compensating for said quiescent current, such that said current sensing circuit senses currents in the main switch which are smaller than the quiescent current multiplied by the sensing ratio, wherein said compensatory device overcompensates for said quiescent current, and wherein there is provided a resistive element with greater resistance than said mirror switch in the first leg of said difference amplifier.

24. A current sensing circuit for sensing the current through a main switch, said circuit comprising:

a mirror switch, said mirror switch being substantially similar to said main switch but of different dimensions, a difference amplifier having a first leg and a second leg connected respectively to the output electrodes of said main switch and said mirror switch, said difference amplifier ensuring that the voltage across said first leg and across said second leg are substantially equal and thereby to derive from said mirror switch a sensing current substantially equal to a current flowing in said main switch divided by a sensing ratio, a current source for producing a quiescent current in said difference amplifier, and a compensatory device for compensating for said quiescent current, such that said current sensing circuit senses currents in the main switch which are smaller than the quiescent current multiplied by the sensing ratio, wherein said compensatory device overcompensates for said quiescent current, there are provided two resistive elements in series in the first leg of said difference amplifier, and there are provided two devices, substantially similar to said mirror switch, in series and arranged to be always on.

25. A current sensing circuit for sensing the current through a main switch, said circuit comprising:
   a mirror switch, said mirror switch being substantially similar to said main switch but of different dimensions,
   a difference amplifier having a first leg and a second leg connected respectively to the output electrodes of said main switch and said mirror switch, said difference amplifier ensuring that the voltage across said first leg and across said second leg are substantially equal and thereby to derive from said mirror switch a sensing current substantially equal to a current flowing in said main switch divided by a sensing ratio,
   a current source for producing a quiescent current in said difference amplifier, and
   a compensatory device for compensating for said quiescent current, such that said current sensing circuit senses currents in the main switch which are smaller than the quiescent current multiplied by the sensing ratio,
   wherein said compensatory device overcompensates for said quiescent current, and
   there is provided one device substantially similar to said mirror switch but a current larger than the quiescent current is passed through it.

26. The current sensing circuit according to claim 25 wherein the current passed through said one device substantially similar to said mirror switch is two-times the quiescent current.

27. The current sensing circuit according to claim 25 further comprising another current source in series with a single mirror switch and in parallel with said difference amplifier.

28. A current sensing circuit for sensing the current through a main switch, said circuit comprising:
   a mirror switch, said mirror switch being substantially similar to said main switch but of different dimensions,
   a difference amplifier having a first leg and a second leg connected respectively to the output electrodes of said main switch and said mirror switch, said difference amplifier ensuring that the voltage across said first leg and across said second leg are substantially equal and thereby to derive from said mirror switch a sensing current substantially equal to a current flowing in said main switch divided by a sensing ratio,
   a current source for producing a quiescent current in said difference amplifier, and
   a compensatory device for compensating for said quiescent current, such that said current sensing circuit senses currents in the main switch which are smaller than the quiescent current multiplied by the sensing ratio,
   wherein said difference amplifier is further provided with dummy transistors, and
   wherein said dummy transistors are arranged such that inputs of said difference amplifier are switched to the dummy transistors when said main switch and mirror switch are off.

* * * * *